United States Patent [19]
Bartilson

[11] Patent Number: 5,315,479
[45] Date of Patent: May 24, 1994

[54] AIR MANIFOLD FOR COOLING ELECTRONIC COMPONENTS

[75] Inventor: Bradley W. Bartilson, Chippewa Falls, Wis.

[73] Assignee: Cray Research, Inc., Eagan, Minn.

[21] Appl. No.: 7,100

[22] Filed: Jan. 21, 1993

[51] Int. Cl.⁵ .......................................... H05K 7/20
[52] U.S. Cl. ............................. 361/690; 165/80.3; 361/692
[58] Field of Search .................. 174/16.3; 165/104.33, 165/80.3, 80.4; 181/211; 361/381–389, 412

[56] References Cited

U.S. PATENT DOCUMENTS

| | | | |
|---|---|---|---|
| 3,528,492 | 9/1970 | Austin | 361/383 |
| 4,674,004 | 6/1987 | Smith et al. | 361/384 |
| 4,851,965 | 7/1989 | Gabuzda et al. | 361/383 |
| 4,884,168 | 11/1989 | August et al. | 361/382 |
| 5,083,194 | 1/1992 | Bartilson | 361/384 |
| 5,159,529 | 10/1992 | Lovgren et al. | 361/382 |
| 5,166,775 | 11/1992 | Bartilson | 361/383 |

OTHER PUBLICATIONS

Brzyski et al, "Burn–In Fixture for Modules", IBM Tech. Disc. Bulletin, vol. 27, No. 7B, Dec. 1984, p. 4278.

*Primary Examiner*—Gregory D. Thompson
*Attorney, Agent, or Firm*—Daniel J. Kluth

[57] ABSTRACT

In a cooling system, an air manifold provides an equalized static pressure so that the air manifold evenly distributes air in a uniform basis without varying static pressures and volumes at each chip site on a printed circuit board. The air manifold is also distributes this air at the lowest possible volume so that the pumping energy required and the associated pumping noise are minimized.

4 Claims, 9 Drawing Sheets

AIR MANIFOLD FOR COOLING ELECTRONIC COMPONENTS

BACKGROUND OF THE INVENTION

1. Field of the Invention

The present invention relates to a cooling system for used with electronic devices. More particularly, the present invention relates to air manifolds for an air jet impingement cooling system using miniature pin-fin heat sinks.

2. Description of Related Art

Air-cooled electronic systems traditionally provide a large air manifold between printed circuit boards to create an air path with a static air pressure so as to effectively dissipate heat generated from the electrical chips on printed circuit boards to the outside. However, the size of air manifolds has to be reduced to satisfy the need of small-dimension microelectronic package requirements. Accordingly, there is a need to provide small manifolds in thickness to keep interboard interconnecting close at the same time equalizing of static pressure on the thin manifolds.

To provide air cooling to densely packaged integrated circuits, air manifolds are typically used to distribute high volumes of low pressure air to the integrated circuit sites. Air manifolds have special problems in distributing static air pressure on a uniform basis to each chip site. It is essential for the proper operation of the electronic system that same static air pressure and same volume of air are provided at the each chip site.

There is a further need in the prior art to distribute air at the lowest possible volume so that the pumping energy required and the incumbent noise associated with the pumping are minimized.

SUMMARY OF THE INVENTION

To overcome the limitations in the prior art described above, and to overcome other limitations that will become apparent upon reading and understanding this specification, the present invention describes a thin air manifold for use between electronic modules to achieve a high heat transfer rate per volume and to provide a static regain zone at specific sites where the static pressure is equalized.

Another object of the present invention is to reduce the volumetric air flow requirement but still produce an effective cooling capacity.

Yet another object of the present invention is to provide less heat rise, less incumbent noise and less energy required for pumping the air.

These and various other advantages and features of novelty which characterize the invention are pointed out with particularity in the claims annexed hereto and forming a part hereof. However, for a better understanding of the invention, its advantages, and objects obtained by its use, reference should be had to the drawing which forms a further part hereof, and to the accompanying descriptive matter, in which there is illustrated and described a preferred embodiment of the invention.

BRIEF DESCRIPTION OF THE DRAWINGS

In the drawings, where like numerals refer to like elements and letters generally indicate corresponding parts throughout the several views.

DETAILED DESCRIPTION OF THE PREFERRED EMBODIMENT

In the following detailed description, reference is made to the accompanying drawings which form a part hereof and in which is shown by way of illustration a preferred embodiment in which the invention may be practiced. It is to be understood that other embodiments may be utilized and that structural changes may be made without departing from the scope of the present invention.

The preferred embodiment of the present invention relates to air manifolds for evenly distributing air in a uniform basis without varying static air pressures and volumes at each chip site and for distributing air at the lowest possible volume so that the pumping energy required and the associated pumping noise are minimized.

Figure 1:
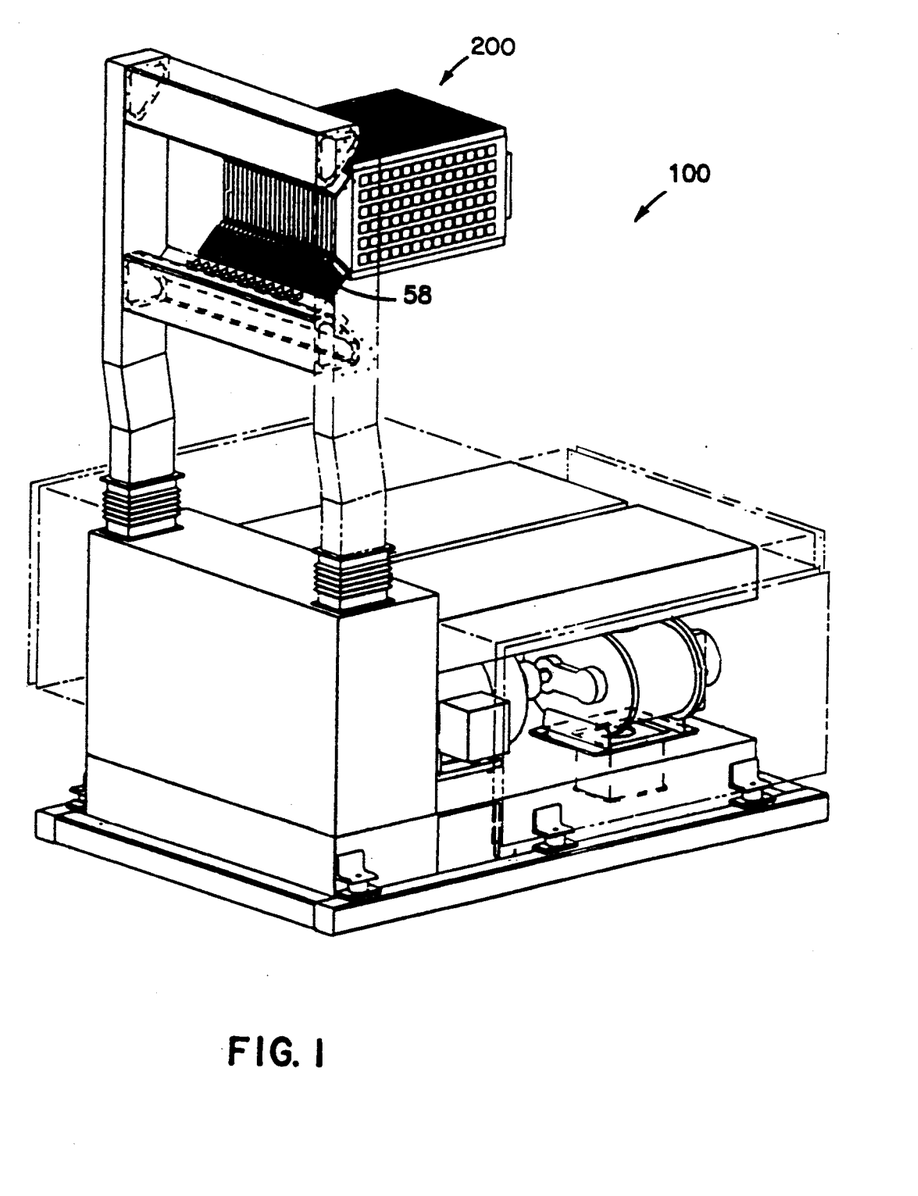
FIG. 1 is a perspective view of a stack of an electronic module stack and an air distribution apparatus according to the principles of the present invention.

High levels of integration for a microelectronic package inevitably results in increases in the power density of the package. FIG. 1 shows a stack of a circuit board module stack and an air distribution apparatus 100. The air distribution apparatus 100 transfers cooling air flow to the stacked printed circuit board 200. This system is described more fully in U.S. Pat. No. application Ser. No. 07/855,384, filed on Mar. 20, 1992, now pending, by Bradley W. Bartilson, entitled "AIR DISTRIBUTION SYSTEM AND MANIFOLD FOR COOLING ELECTRONIC COMPONENTS", is hereby incorporated by reference. This reference is not prior art to the present invention.

Figure 4:
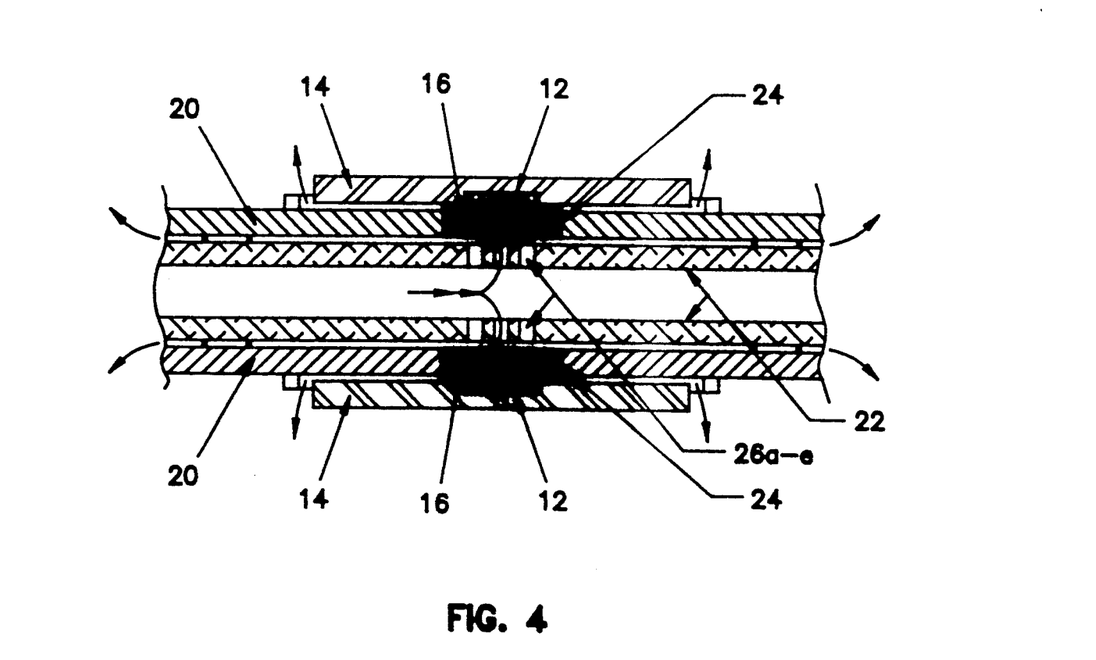
FIG. 4 is a portion of a cross-sectional side view of an air manifold mounted adjacent to printed circuit boards.

For the purpose of illustration of the air distribution apparatus 100, two stacked printed circuit boards 20 with a pressure equalization air manifold 22 (see FIG. 11) are shown in the following discussion. A portion of a cross-sectional view of the air distribution apparatus is shown in FIG. 4.

The pressure equalization air manifold 22 is an improved manifold compared to the previously disclosed air manifolds which are described in the commonly assigned U.S. Pat. No. 5,083,194, by Bradley W. Bartilson, entitled "AIR JET IMPINGEMENT ON MINIATURE PIN-FIN SINKS FOR COOLING ELECTRONIC COMPONENTS" and U.S. Pat. No. 5,166,775, by Bradley W. Bartilson, entitled "AIR MANIFOLD FOR COOLING ELECTRONIC DEVICES". This earlier manifold operated with an inlet pressure of approximately 55.56 in. H₂O (2psi). These patents are hereby incorporated by reference. These patents are not prior art to the present invention. The present invention provides a static air pressure and a reduced volumetric air flow but still meets the requirement to produce the same cooling effect.

Figure 2:
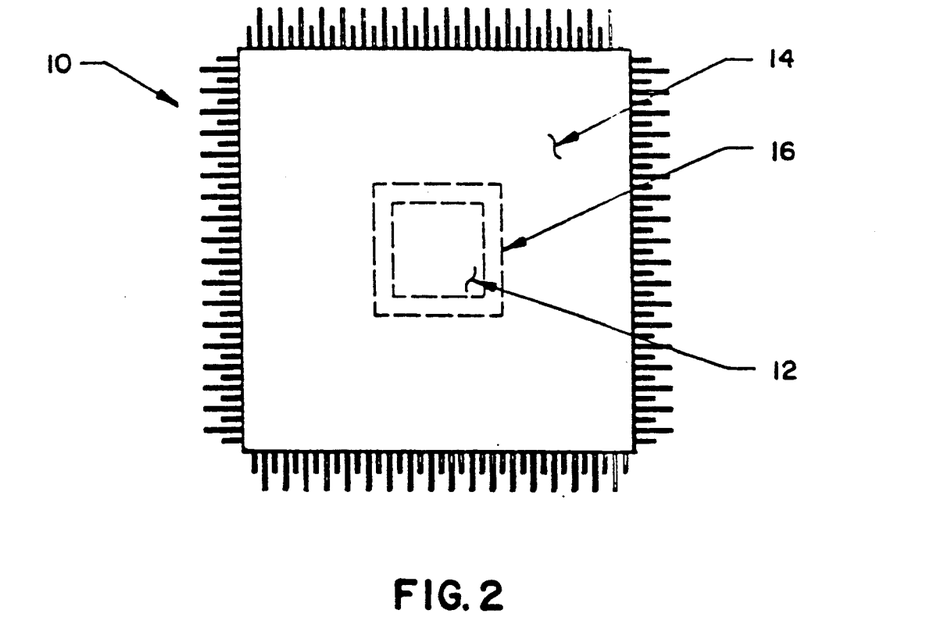
FIG. 2 is a top view of an integrated circuit.

FIG. 2 is a top view of a dense microelectronic package, i.e., a typical 2500 gate array integrated circuit 10 comprised of a silicon die 12 and a ceramic package 14. The silicon die 12 measures approximately 0.265" × 0.265" × 0.020" and is mounted in the center of the ceramic package 14, which measures approximately 1.14" × 1.14" × 0.105". This integrated circuit 10 may generate more than 12 watts of heat during its operation and thus requires an efficient method for dissipating heat.

Figure 3:
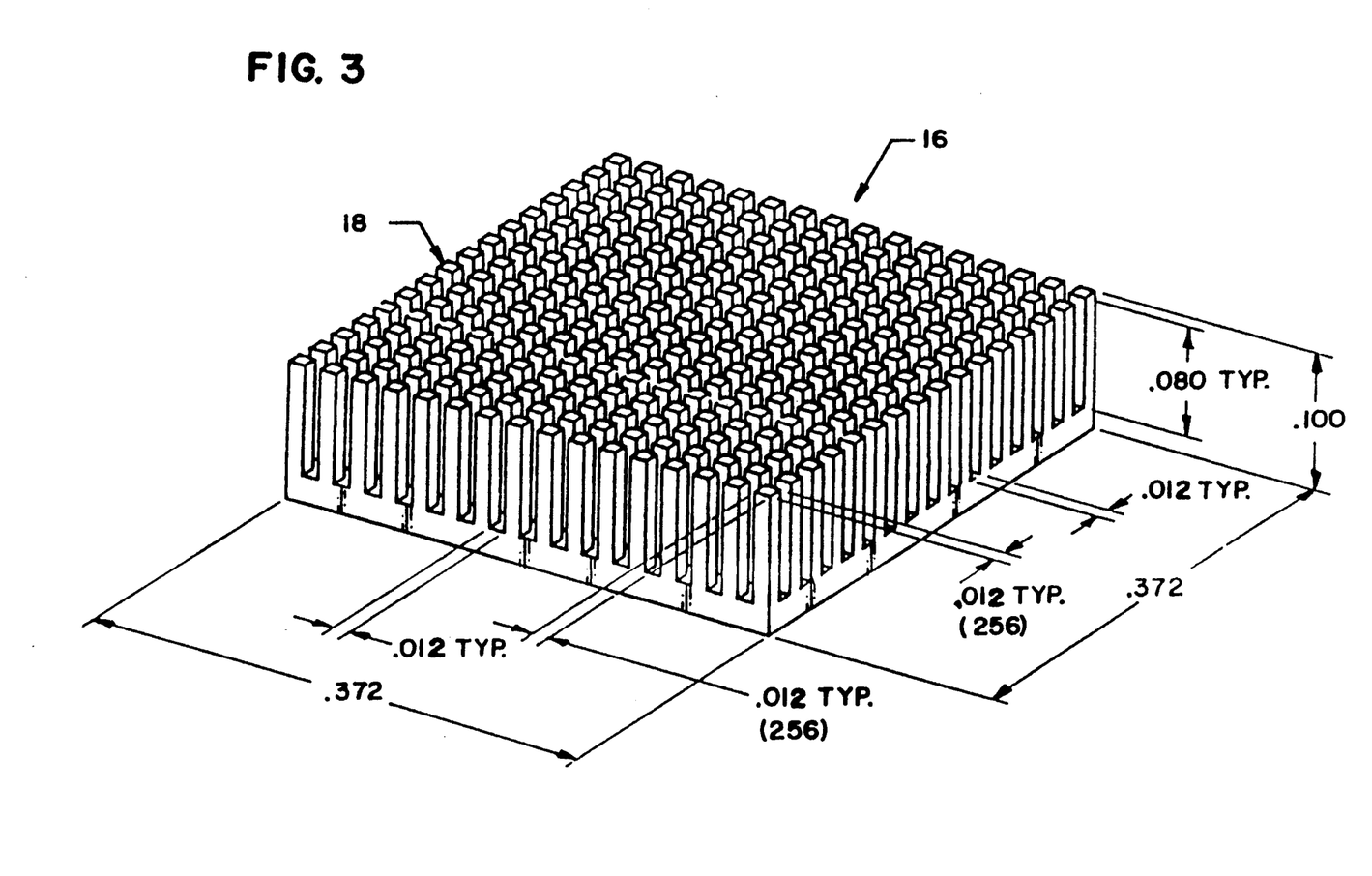
FIG. 3 is a top view of a miniature pin-fin heat sink.

FIG. 3 shows the configuration of the miniature pin-fins heat sink 16 used in the preferred embodiment of the present invention. The heat sink 16 measures 0.375" × 0.375" × 0.100" and has 256 pin-fins 18 measuring 0.012" × 0.012" × 0.080" and separated by 0.010" channels. (For a given fin size, the surface area per volume is maximum when the channel size is equal to the fin size). Thus, the pin-fins 18 are arranged in a 16 × 16 matrix having a volume 0.0136 cubic inches. Those skilled in the art will recognize that further increases in the fin density produce greater heat transfer coefficients, allowing the flow rate to be reduced while maintaining the required 80° C. die temperature.

The heat sink 16 is usually centered on the ceramic package 14 and mounted to the underside thereof. The heat sink 16 may be glued to the underside of the ceramic package 14 using a crushed diamond thermal epoxy. The thickness of the thermal epoxy preferably does not exceed 0.002".

The air manifold 22, printed circuit board (PCB) 20, and integrated circuit layout for an electronic module in the preferred embodiment of the present invention is partially shown in FIG. 4.

An analysis of the temperature distribution throughout the ceramic package 14 shows that the primary heat path is in a small area beneath the silicon die 12. A miniature pin-fin heat sink 16 is used in the preferred embodiment to facilitate thermal transfer from the primary heat path. FIG. 4 also shows another heat path between the air manifold 22 and the printed circuit boards 20 for dissipating heat generated from the silicon die 12.

The PCBs 20 are attached to each side of the air manifold 22, preferably using spacers or like connectors (not shown), thereby providing a gap between the PCB 20 and the air manifold 22 for the exhaust of the air flow. In the preferred embodiment, each PCB 20 may have six rows of 13 integrated circuits 10. Each integrated circuit 10 is mounted over an aperture 24 in the PCB 20 and secured thereto by means of a wave soldering process, or some other means of attachment. Attached to the underside of the ceramic package 14 and extending through the aperture 24 is the miniature pin-fin heat sink 16. An air flow with average velocity of 75 ft/sec exits from nozzles 26a–e and is directed through the aperture 24 to the electronic chips and further dissipates heat through two air dissipating paths to the outside.

Figure 5:
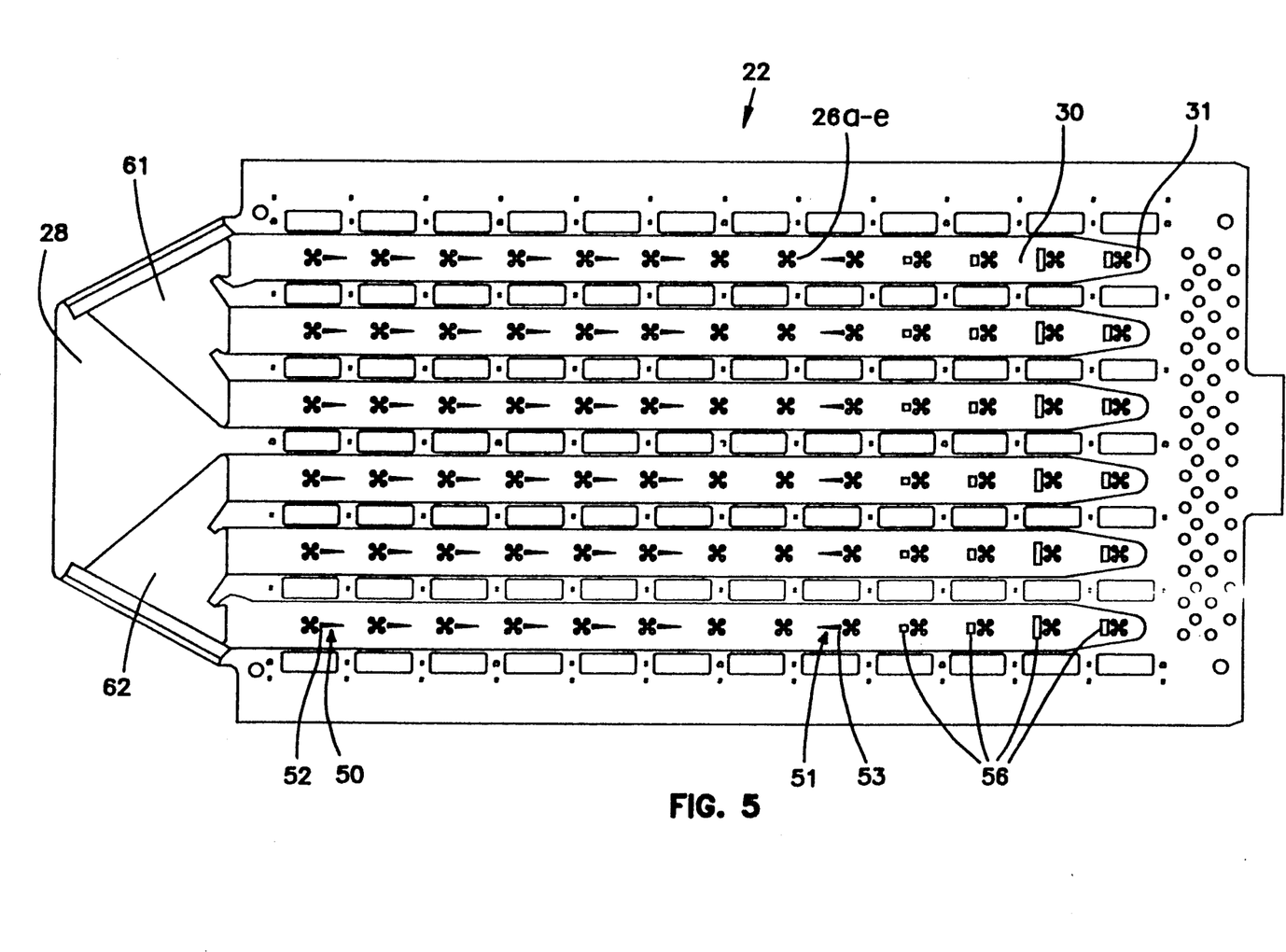
FIG. 5 is a plane view of the air manifold.
Figure 6:
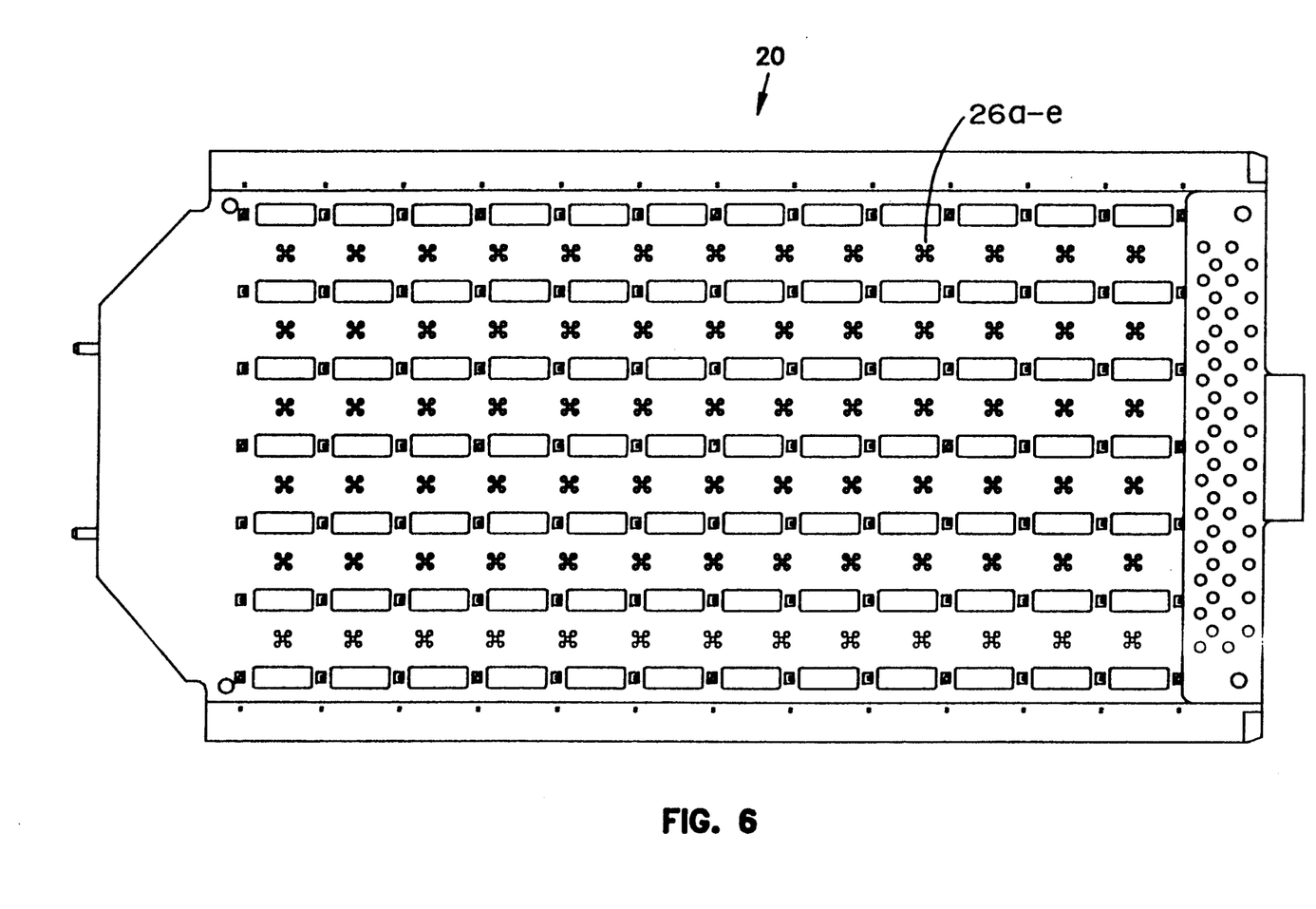
FIG. 6 is a plane view of the printed circuit board connecting to the top of the air manifold.
Figure 11:
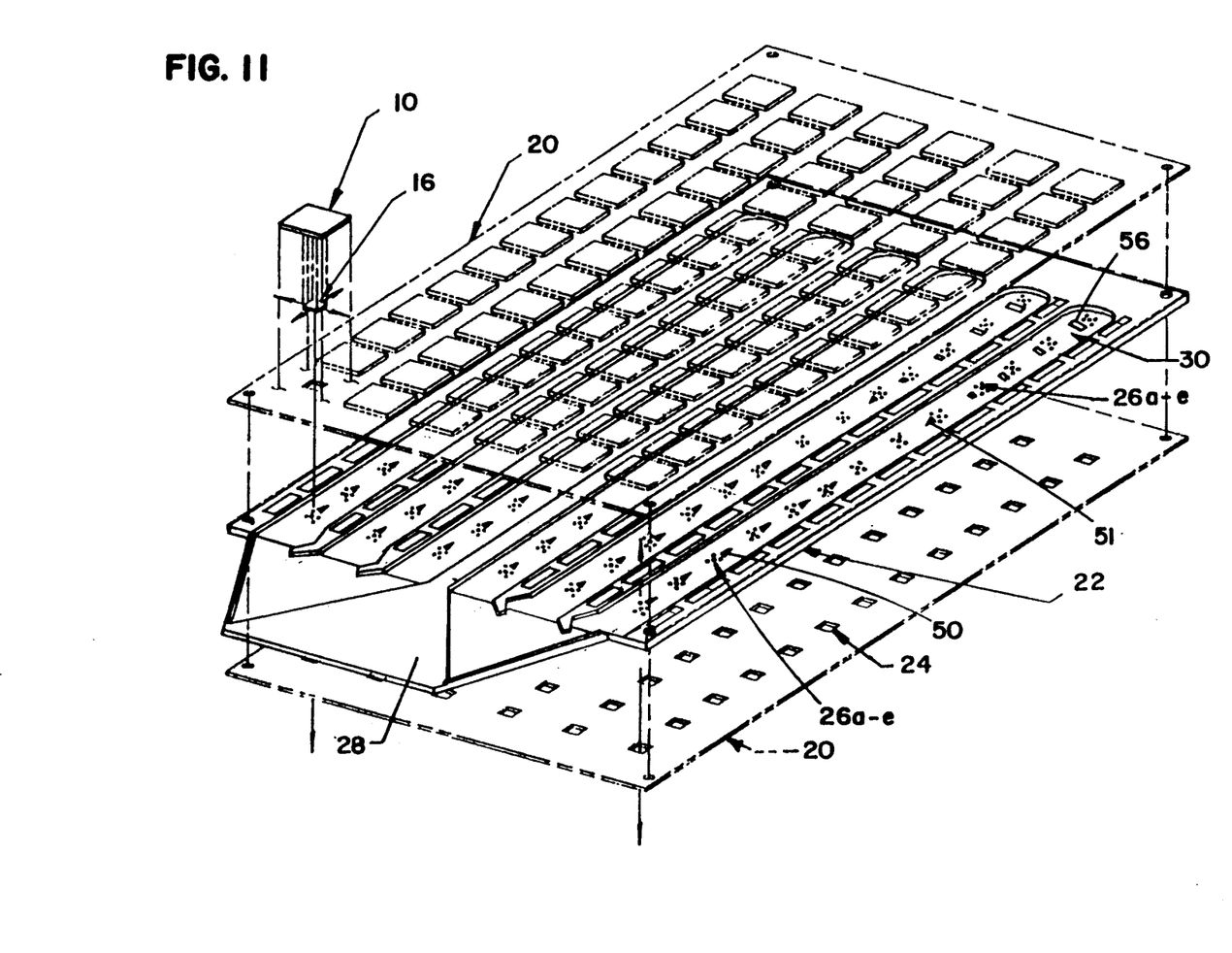
FIG. 11 is an exploded view of an embodiment of an electronic module including an air manifold with printed circuit boards mounted thereon.

The air manifold 22, shown in FIG. 5, has six 1.200" × 0.125" × 20.0" long channels 30, each of which provide equivalent air flow to 13 groups of nozzles 26a–e on the air manifold 22. Each group of nozzles 26a–e includes five sub-nozzles wherein four sub-nozzles are disposed on four corners of a 0.172" × 0.172" square and the other one is disposed on the center of the square. The diameter of each sub-nozzles is 0.073". The air enters each of channels 30 at an inlet 28 and exits at the 13 groups of the nozzles 26a–e. The nozzles 26a–e disposed on a top planar surface and a bottom planar surface are respectively shown in FIGS. 6 and 7. These nozzles direct the air flow to the printed circuit boards 20. One end 31 of the channel 30, opposite to the inlet 28, is tapered to decrease the air flow resistance. For simplifying the drawing, FIG. 11 shows only one of the channels 30 with the nozzles 26a–e disposed therein and other features. It is appreciated that other five channels 30 which are not shown the nozzles 26a–e, etc., have the same features as the one shown.

Pressure boundary conditions are preferably inches of water (H₂O) (approximately 0.36psi) at the inlets 28 thereby providing the reduced air flow. Without equalization, there is a static air pressure differential distribution from the inlets 28 to each group of nozzles 26a–e along the air flow in the channel 30. The static pressure at the upstream of the air flow is lower than the static pressure at the downstream of the air flow. In the preferred embodiment shown in FIG. 5, "catchers" 50 or "diverters" 51 are situated around the nozzles 26a–e to equalize the static air pressure wherein the catchers 50 are used to catch more air to increase the pressure around the nozzles and the diverters 51 are used to divert more air to decrease the static pressure around the nozzles. One of the catchers 50, having a blunt end 52 facing toward the air flow, is horizontally positioned at back of the first six groups of the nozzles 26a–e to increase the static air pressure at the nozzles. One of the diverters 51, having a blunt end 53 facing away from the air flow, is horizontally positioned in front of the ninth group of the nozzles 26a–e to decrease the static air pressure at the nozzles. The width of the catcher 50 decreases as you proceed from the inlet 28 further into the channel 30 so that the catcher 50 at the first group of the nozzles directs more air than that of at the second group of nozzles, and so on. A rectangular member 56 is disposed in front of the last four groups of the nozzles 26a–e to direct more air away from the nozzles so as to decrease the static air pressure at the nozzles. The size of the rectangular 56 increases as you proceed from the inlet 28 further into the channel 30 except the rectangular 56 in front of the last group of the nozzles 26a–e because the tapered end 31 of the channel 30 helps to reduce the pressure required. There is no catcher 50 or diverter 51 or rectangular 56 positioned around the remaining two groups of nozzles 26a–e, between the sixth and ninth groups of the nozzles as they have the same pressure as formed in the first six groups and in the last five groups of nozzles. Accordingly, an equalized static air pressure zone is formed in the air manifold 22.

In the preferred embodiment, there is little or no gap between the nozzles 26a–e and the top of the miniature pin-fin heat sink 16. Such a configuration provides the highest packaging efficiency and thermal transfer characteristics. Preferably, the air flow exiting from the nozzles 26a–e does not expand prior to impinging upon the miniature pin-fin heat sink 16, where it is broken up into separate air paths.

The manifold 22 dissipates approximately 12.6 watts with the air flow speed is approximately 75 feet/second, to obtain a temperature rise of 63° C. and a corresponding thermal resistance of 5.0° C./watt. In this preferred embodiment, heat flux can exceed 10,000 Btu/hr.ft$^2$ from the miniature pin-fin heat sink 16.

While it is desirable to achieve the highest possible thermal efficiency for cooling electronic devices, it is also advantageous to avoid re-packaging electronic modules and assemblies.

Figure 7:
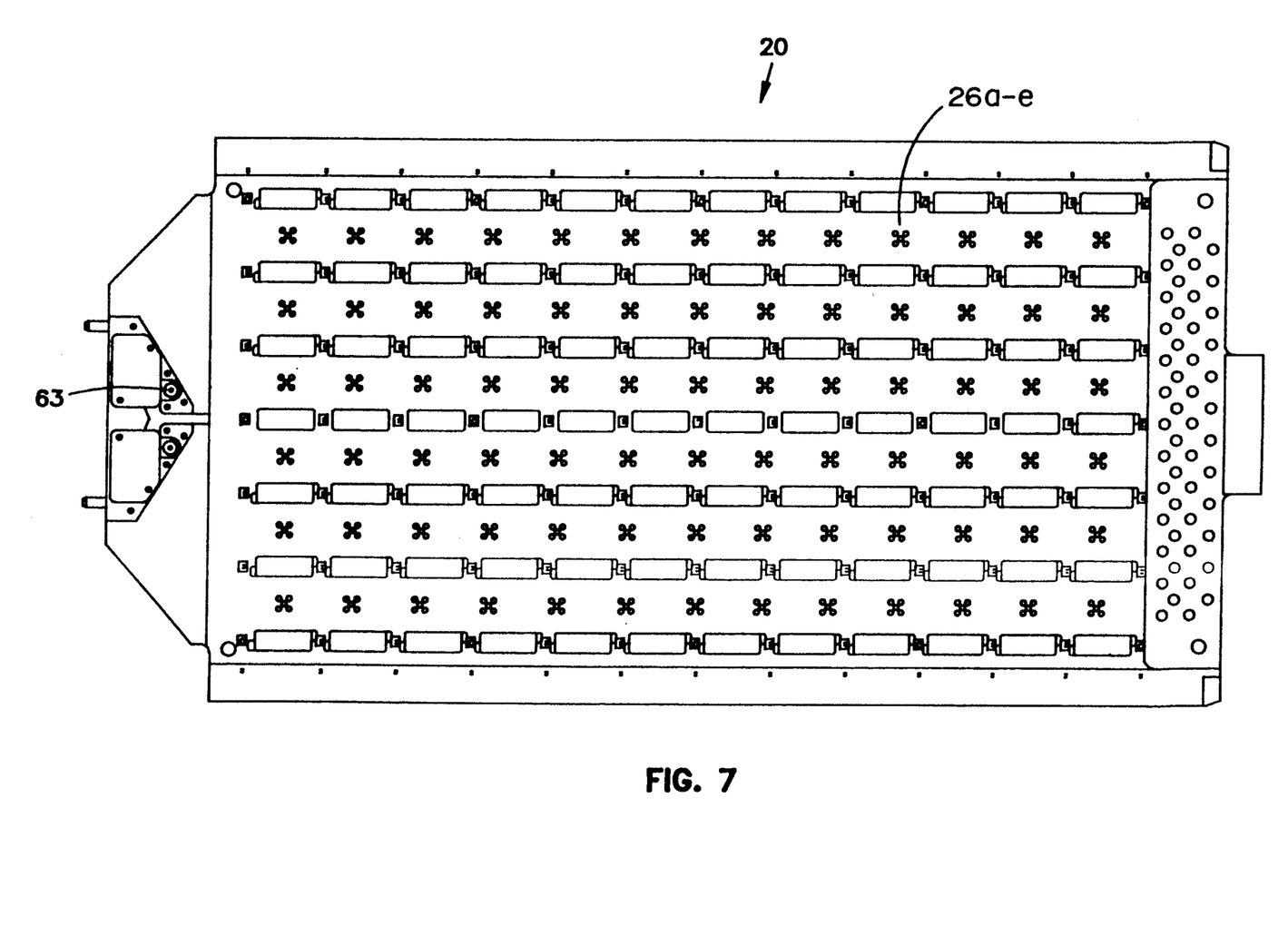
FIG. 7 is a plane view of the printed circuit board connecting to the bottom of the air manifold.
Figure 8:
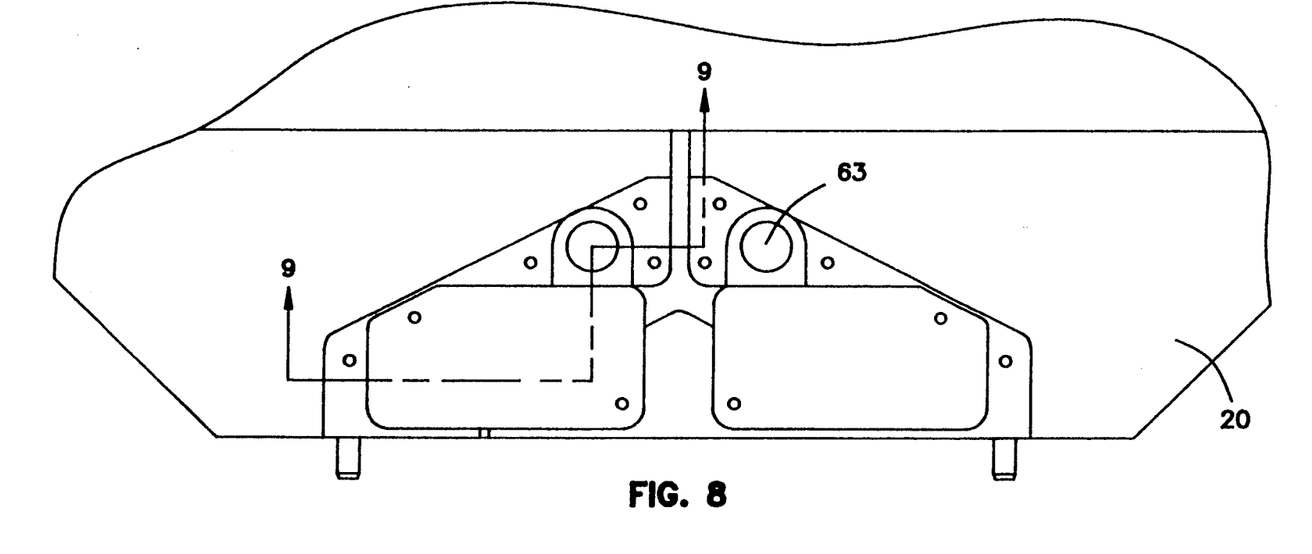
FIG. 8 is an enlarged plane view of pressure sense boards embedded in the printed circuit board.
Figure 9:
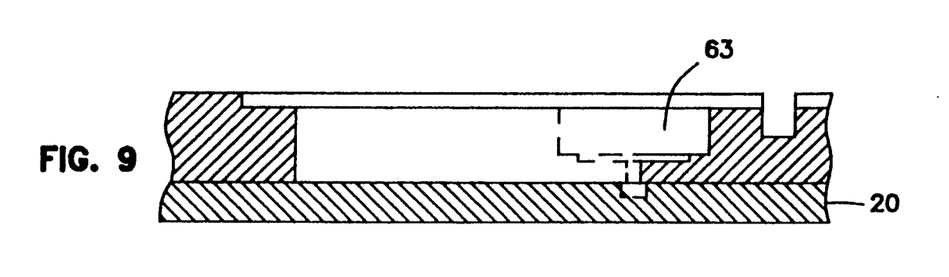
FIG. 9 is a cross-sectional view of the pressure sense boards along the line 9—9 in FIG. 8.

FIG. 7 also shows that pressure sense boards 63 are embedded in the printed circuit board 20 at the inlet side of the air manifold 22. The pressure sense boards 63 sense the air pressure of the air flow so as to control the pressure of the air manifold 22. The enlarged plane view and the cross-sectional view of the pressure sense boards 63 are shown in FIGS. 8 and 9.

Figure 10:
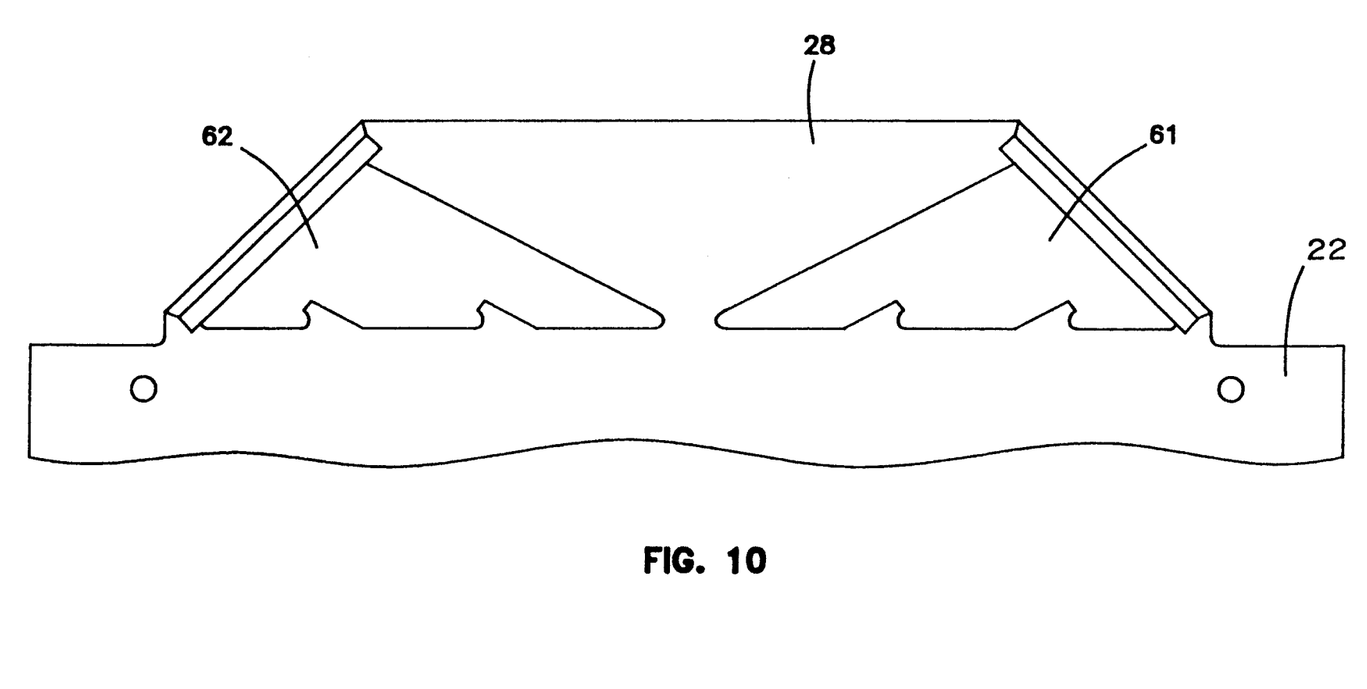
FIG. 10 is an enlarged plane view of an inlet portion of the air manifold.

Now, referring to FIG. 10, an enlarged plane view of the inlet 28 is shown. The air flow is directed through flexible ducts 58 (see FIG. 1) which are angled toward the inlet 28 of the air manifold 22. The inlet 28 has two air flow tubes 61,62 angled relative to the air manifold 22 to provide a uniform and greatest volumetric air flow into the air manifold 22. The rectangular ends of the ducts 58 connect to the rectangular ends of the inlet 28 so as to maximize the cross-sectional area of the inlet 28 and to minimize flow resistance.

Although a preferred embodiment has been illustrated and described for the present invention, it will be appreciated by those of ordinary skill in the art that any apparatus which is calculated to achieve the same purpose may be substituted for the specific configuration shown.

For example, any fluid may be used with the present invention as a substitute for air. Preferably, the cooling air used is one that flows easily, has good thermal transfer characteristics, and has minimal electrical conductivity and does not require expensive and cumbersome pumping and recovery systems, in contrast to what may be required for other cooling fluids. In addition, the number of nozzles in each group and their configuration and arrangement may be different with the present invention. Preferably, five nozzles in each group used is one that direct air effectively because analysis and tests indicates that five nozzles provide a good thermal performance.

This application is intended to cover any adaptations or variations of the present invention. Therefore, it is manifestly intended that this invention be limited only by the claims and the equivalents thereof.

What is claimed is:

1. An air manifold, having a top planar surface and a bottom planar surface, adapted for mounting a top and bottom boards adjacent thereto, comprising:
   air flow channels defined between the top planar surface of the air manifold and the top board, and between the bottom planar surface of the air manifold and the bottom board, each of said channels having an air inlet end and a tapered end;
   a plurality of nozzles positioned along said air flow channels for expelling air therefrom to cool said top and bottom boards; and
   a plurality of members positioned with respect to said plurality of nozzles, said members changing in size as the distance between the air inlet end and said members increases, said members being positioned adjacent to at least five of said plurality of nozzles, wherein said plurality of members includes a first member, having a blunt end facing toward said air inlet end of said air flow channels, positioned between said air inlet end an said plurality of nozzles, a second member, having a blunt end facing away from said air inlet end, positioned between said plurality of nozzles and said tapered end.

2. An air manifold in accordance with claim 1, further including a third member, having a square shape, disposed between said plurality of nozzles and said tapered end.

3. An air manifold in accordance with claim 2, wherein each of said members is positioned with five nozzles.

4. An apparatus for using a cooling air flow to dissipate heat from electronic devices mounted on a printed circuit board, comprising:
   (a) an air manifold, having a top planar surface and a bottom planar surface, adapted for mounting top and bottom printed circuit boards adjacent thereto, comprising:
      air flow channels defined between the top planar surface of the air manifold and the top printed circuit board, and between the bottom planar surface of the air manifold and the bottom printed circuit board, each of said channels having an air inlet end and a tapered end;
      a plurality of nozzles positioned along said air flow channels for expelling air therefrom to cool said top and bottom boards;
      a plurality of members positioned with respect to said plurality of nozzles, said members changing in size as the distance between the air inlet end and said members increases, said members being positioned adjacent to at least five of said plurality of nozzles; and
   (b) inlet means for accepting the cooling air flow into said air inlet end of said air flow channels, said inlet means including an inlet angled toward said air manifold.

* * * * *